United States Patent [19]

Wagner et al.

[11] Patent Number: 5,031,066

[45] Date of Patent: Jul. 9, 1991

[54] DC ISOLATION AND PROTECTION SYSTEM AND CIRCUIT

[75] Inventors: Charles A. Wagner, North Edwards; Gary V. Kellogg, Lancaster, both of Calif.

[73] Assignee: The United States of America as represented by the Administrator of the National Aeronautics and Space Administration, Washington, D.C.

[21] Appl. No.: 369,487

[22] Filed: Jun. 21, 1989

[51] Int. Cl.[5] .............................................. H02H 9/04

[52] U.S. Cl. ........................................ 361/56; 361/90; 361/91; 361/111

[58] Field of Search ........................ 361/86, 87, 91, 93, 361/98, 100, 90, 56, 111

[56] References Cited

U.S. PATENT DOCUMENTS 4,476,402 10/1984 Best .................................. 361/91 X 4,495,536 1/1985 Bynam .................................. 361/91

4,544,981 10/1985 Hokoopion .......................... 361/93

*Primary Examiner*—Todd E. DeBoer

*Attorney, Agent, or Firm*—Darrell G. Brekke; Harold W. Adams; John R. Manning

[57] ABSTRACT

A precision analog electronic circuit that is capable of sending accurate signals to an external device that has hostile electric characteristics, including the presence of very large common mode voltages. The circuit is also capable of surviving applications of normal mode overvoltages of up to 120 VAC/VDC for unlimited periods of time without damage or degradation. First, the circuit isolates the DC signal output from the computer. Means are then provided for amplifying the isolated DC signal. Further means are provided for stabilizing and protecting the isolating and amplifying means, and the isolated and amplified DC signal which is output to the external device, against overvoltages and overcurrents.

24 Claims, 1 Drawing Sheet

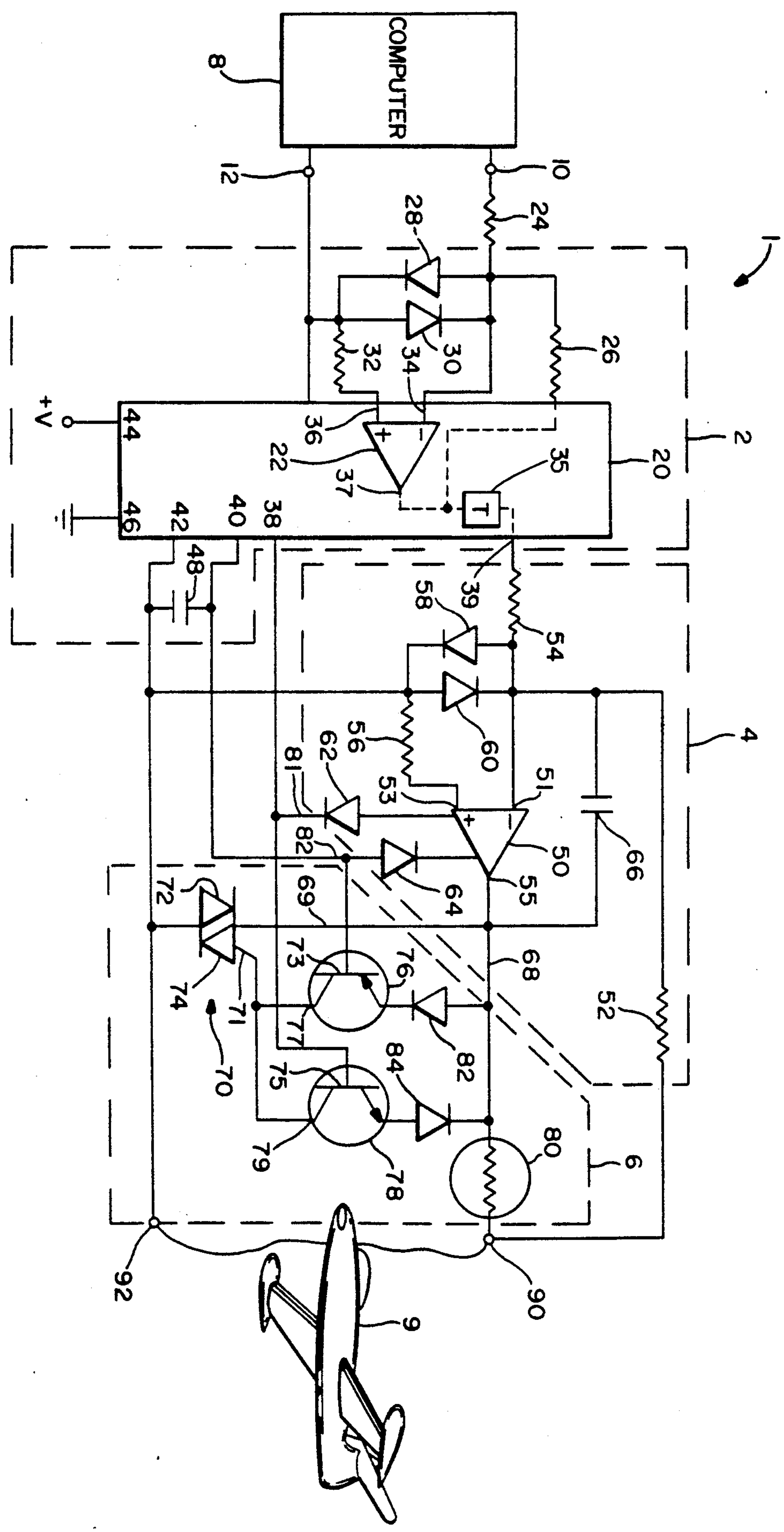
COMPUTER

DC ISOLATION AND PROTECTION SYSTEM AND CIRCUIT

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

1. Field of the Invention

The present invention relates generally to sending analog signals between a computer and an external device. More specifically, the present invention relates to sending precision analog signals between a computer and external device that has hostile electrical characteristics, including the presence of very large common mode voltages and normal mode overvoltages of up to 120 VAC/VDC.

2. Description of the Prior Art

The prior art for this field relates specifically to utilizing a flight simulation computer to send a precision analog signal to an actual aircraft located in a hangar. Such signals are necessary to enable certain testing to be performed on the aircraft General prior art for this invention relates to a precision analog transmission interface when the described hostile electrical conditions exist.

Under the present state of prior art, when computers are expected to deliver precision analog voltages to various external devices for excitation purposes, two problems are frequently encountered. The first is a significant difference in the ground potential between the desired computer and the specific external device This problem is compounded when the external device contains within itself significant ground potential differences from point to point, and the interconnects to be made involve various points on the external device.

For instance, these ground potential differences, or common mode voltages, often exceed the output range of the sending amplifiers, which usually are limited to +or - 10 volts. In some cases, the receiving amplifier is of the differential type, which can compensate for much of the common mode voltage, provided it is not too large. However, in other cases, the receiving amplifier is a single-ended type and cannot compensate for ground potential differences. If the common mode voltage is too high, even the differential amplifier cannot compensate for ground potential differences.

The second problem is that, as a result of either wiring errors or equipment failures, large voltage sources up to 120 VAC/VDC are occasionally applied to the signal leads. When this occurs, the sending amplifier and other related components are instantly destroyed, causing expensive downtime while repairs are made.

Prior art has developed an electronic output circuit that can withstand the application of large voltage sources without damage. This circuit, however, is directly coupled and is not capable of operation in a large common mode voltage environment. Thus the approach has been to force the ground potentials of the sending computer and the external device (e.g. aircraft) to be close to each other by connecting heavy ground cables.

That prior art attempt to force ground potentials together using heavy cables sometimes works and sometimes fails. This approach also causes large ground loop currents to flow, which sometimes leads to erratic computer operation. In general, solving this problem often requires a case-by-case trial-and-error solution, which varies from problem to problem. Much time is often consumed trying to get the system to work.

An additional limitation of prior technology is that when the external device (e.g. aircraft) has significant ground potential differences within itself, errors occur when analog voltages are sent to some other part of the device that does not have a direct ground connection. If the receiving circuits are of the differential type, and if the common mode voltages are not too large, signal quality is acceptable. However, if either the receiving circuits are single-ended or the common mode voltage is too high, signal quality degrades and can become completely unusable.

Other prior art includes U.S. Pat. No. 3,617,907, issued to R. Garzon on Nov. 2, 1971, which discloses phase shifted voltage clipping of a signal pulse.

U.S. Pat. No. 3,617,906 issued to R. Garzon on Nov. 2, 1971, discloses generating a signal pulse in relation to an asymmetric pulse reaching its zero value by phase shifting both the sinusoidal term and exponential term of a defining current.

U.S. Pat. No. 4,499,609 issued to W. Muska on Feb. 38, 1983, discloses a voltage comparator for quantizing the output to a logic level signal comprising symmetrical clamp means interposed between a post amplifier and the comparator.

U.S. Pat. No. 3,457,508 issued to Rowlands, et al. on July 22, 1969, discloses a digital pulse repeater system for reconstructing discrete binary signals.

U.S. Pat. No. 3,094,627 issued to J. Van Lottum on June 18, 1963, discloses a pulse transmission circuit having an output terminal and a parasitic capacitance between the output terminal and a constant potential, the circuit including means for eliminating adverse effects of the parasitic capacitance.

U.S. Pat. No. 4,071,780 issued to R. Burnett on Jan. 31, 1978, discloses a digital equipment tester utilizing digital circuitry for the control of any output transient voltages.

U.S. Pat. No. 3,573,641 issued to G. Zenk on Apr. 6, 1971, discloses a circuit for scanning celestial space wherein signal inputs provided by the sensor are compared to a signal indicative of the noise background envelope to eliminate the effects of noise.

SUMMARY OF THE INVENTION

Accordingly, it is an object of this invention to provide precise analog signal transmission from a computer to an external device that has hostile electrical characteristics. These hostile characteristics may include large common mode voltage differences within the device itself as well as between it and the computer.

It is another object of the invention to provide the same precise analog communication where there is a significant difference in the ground potential between the computer and the external device.

It is another object of the invention to provide the same precise analog communication where the external device contains within itself significant ground potential differences from point to point.

It is still another object of the invention to provide a precision analog output interfacing circuit that can operate effectively in the presence of large common mode voltages and also survive major fault conditions for indefinite periods without suffering any damage or degradation.

The attainment of these and related objects may be achieved through use of the novel DC isolation and protection circuit herein disclosed. A DC isolation and protection circuit in accordance with this invention has an input precision isolation amplifier which isolates the DC component of the input computer signal. This amplifier is protected by electrical protection componentry including diodes, resistors and capacitors The output of the precision isolation amplifier is fed to a low power precision operational amplifier which provides adjustable gain, low power consumption and output swing very close to its power supply rails. The low power precision operational amplifier is likewise protected by protection componentry.

The precision operational amplifier output is passed through overload control circuitry. This circuitry includes means for eliminating or minimizing overload voltages and currents The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

The single FIG. 1 is a schematic view of a DC isolation and protection circuit according to the preferred embodiment

DETAILED DESCRIPTION OF THE INVENTION

Turning now to the drawings, more particularly to FIG. 1, the DC isolation and protection circuit 1 is comprised of three primary blocks: the DC isolation block 2, the amplification block 4, and the overload control block 6. In the preferred embodiment a computer 8 is connected through the circuit 1 to an external device 9, which may be an aircraft, that has a hostile electrical environment.

The DC isolation block 2 provides a variety of functions. Among those are: isolating the DC component of the signal input from the computer, buffering the input signal (and amplifying it if desired), providing power to componentry within the circuit, and providing protection to the DC isolation components. The DC isolation block 2 passes the DC component of the analog computer signal to the amplification block 4. The amplification block 4 provides precision gain to the analog signal at low power losses. The amplification block 4 also provides protection for its individual componentry, which will be described in detail below.

The output of the amplification block 4 is channeled through an overload control block 6 before entering the external device 9. The overload control block 6 provides protection against overvoltages and overcurrents which may result from faulty wiring or equipment failure, among others. These overloads may reach up to 120 VAC/VDC.

Focusing on the schematic aspects of FIG. 1, the input analog signal from the computer 8 is connected to the circuit 1 at ports 10 and 12. The active signal enters at port 10 and is fed through resistor 24 to the inverting input 34 of the input operational amplifier 22, which is an internal component of isolation amplifier 20. The ground potential is input at port 12 and is fed through resistor 32 to the noninverting input of the operational amplifier 22, and also to the common input of amplifier 20. In the preferred embodiment the gain of the amplifier 22 is set at one. This gain is established by the relative values of feedback resistor 26 and input resistor 24. The feedback resistor 26 is connected between the output 37 of the input operational amplifier 22 and the input 34. The input resistor 24 is connected between input port 10 and the input 34 of the input operational amplifier 22.

The input to the input operational amplifier 22 is protected by diodes 28 and 30 and a resistor 24. The diodes 28 and 30 are voltage clamps. These diodes 28 and 30 in combination with resistor 24 protect the input of the operational amplifier 22 when overload conditions occur. The diodes 28 and 30 prevent large voltage potentials from appearing across the inputs 34 and 36 of the amplifier 22.

The precision isolation amplifier 20 is a device well known in the art. An AD210 type precision isolation amplifier, obtainable from Analog Devices, is suitable. The AD210 isolation amplifier contains an internal transformer 35 coupled between the output of operational amplifier 22 and resistor 54 for isolating the analog signal. In the preferred embodiment, the precision isolation amplifier 20 operates on a +15.5 v power source input 44 and is connected to power source ground 46. The isolation amplifier 20 provides an isolated positive (+) power supply 40 and an isolated negative (−) power supply 38. These power supplies provide positive and negative power to a low power precision operational amplifier 50 The power supplies each have an absolute value of 15 volts. Additional positive and negative power supplies provide isolated power to the input operational amplifier. These are not shown because they are internal to the 3-port isolation amplifier 20.

The 3-port isolation amplifier 20 also contains a voltage return 42. To provide stability in the circuit 1, the +15 v power supply 40 is connected through a capacitor 48 to the voltage return 42. The capacitor 48 is a 10 microfarad tantalum capacitor used to filter the ripple on the +15 v power supply 40. The internal circuitry of the negative supply 38, internal to the isolation amplifier 20, has been filtered more heavily so no external capacitor is needed.

Another stabilizing device, this one pertaining exclusively to the input operational amplifier 22, is a bias current balancing resistor 32. The bias current balancing resistor 32 cancels the effects of bias current and is equal in resistance to the parallel combination of feedback resistor 26 and input resistor 24. It is important to note at this stage that the present invention is not limited to the use of the precision isolation operational amplifier. Alternatively, the circuitry discussed above as internal to the precision isolation amplifier 20 may be provided by individual external components (i.e., power supplies, voltage return, transformer coupler, operational amplifier, etc.).

The DC isolation block 2 outputs its signal at the isolation amplifier output 39. This signal at 39 is measured with respect to the voltage return 42. The isolation amplifier 20 contains 3-way internal transformer coupling between its inputs at 34 and 36, its power source at 44 and 46, and its outputs at 39 and 42. This coupling permits large common mode voltages up to 3500 volts peak between the outputs at 39 and 42 and the inputs at 34 and 36. This coupling also permits large common mode voltages up to 3500 volts peak between the outputs at 39 and 42 and the power source at 44 and 46. The isolated negative power output at 38 and the isolated positive power output at 40 are internally DC coupled to the output amplifier that provides the signal output at 39 referenced to the voltage return 42. Therefore, common mode voltages are not permitted between power outputs 38 and 40 and the signal output at 39 and 42.

The output signal at 39 enters the amplification block 4 and is immediately fed through an input resistor 54 to the inverting input terminal 51 of the low power precision operational amplifier 50. The low power precision operational amplifier 50 provides buffering and gain. A suitable low power precision operational amplifier for these purposes is a Burr Brown OPA-21 which consumes very little power and can swing very close to its power supply rails. These features are important to the present invention and are responsible for the choice of the Burr Brown amplifier.

The positive input terminal 53 of the low power precision amp 50 is connected through a resistor 56 to the voltage return 42. A forward biased diode 58 is connected from the inverting input terminal 51 to the voltage return 42. A reverse biased diode 60 is also connected from the negative input terminal 51 to the voltage return 42. The diodes 58 and 60 protect the input terminal 51 against large voltage potentials that may be applied at 90 and otherwise reach terminal 51 through resistor 52

The gain of the low power precision operational amplifier 50 is set by a feedback resistor 52 and an input resistor 54. The feedback resistor 52 is connected from the output 55 of the precision operational amplifier 50 through a thermistor (which is discussed below) to the inverting input terminal 51 of the precision amplifier 50. The input resistor is connected from the DC isolation block output 39 to the negative input 51 of the precision amplifier 50. In the preferred embodiment the feedback resistor has a value of 150 K ohms and the input resistor 54 has a value of 100 K ohms to produce a gain of 150 K/100 K or 1.5.

Protection for this amplifier 50 against overload voltages applied across terminals 90 and 92 is provided by a plurality of diodes 58-64 and the resistor 52. Diodes 58 and 60 are voltage clamps, and their operation was described previously. In combination with resistor 52, the diodes 58 and 60 protect the input 51 of the amplifier 50. These components serve the same function performed by diodes 28 and 30 and resistor 24 with respect to amplifier 22.

Diode 62 is connected in series to the −15 v supply lead of amplifier 50 and protects amplifiers from reverse flow of current in the negative supply lead when large negative overload voltages are applied at terminal 90 with respect to terminal 92. In an analogous manner, diode 64 protects amplifier 50 from reverse flow of current in its positive supply lead. Without these diodes, it has been found that externally applied overload voltages produce unacceptable levels of reverse current. These diodes 62 and 64 are also significant in the operation of the overload control circuit, as will be pointed out below.

Stability for the precision operational amplifier 50 and surrounding componentry is provided primarily by two components. The first is a capacitor 66 which is connected from the output 55 of the precision amplifier 50 to the inverting input terminal 51 of the precision amplifier 50. It is a stabilizing capacitor. For instance, when a long cable or a complex load is seen by the amplifier 50, ringing occurs. The capacitor 66 stabilizes the ringing.

The second stability device is bias current balancing resistor 56 Resistor 56 is equal in resistance to the parallel combination of the feedback and input resistors 52 and 54, respectively. It cancels the effects of bias current, performing the same function as bias current balancing resistor 32 with respect to the input operational amplifier 22.

Following buffering and amplification, the output of the low power precision operational amplifier 50 is input to the overvoltage and overcurrent control block 6. The output of the amplification block 4 is connected by a first electrical connection 68 through a thermistor 80 to output port 90, where the circuit 1 connects to the external device 9. A second electrical connection 69 connects the amplification circuit output to a triac 70 whose output is connected to the voltage return 42 and output port 92. The thermistor 80 is a solid-state semiconducting device, the electrical resistance of which varies with the temperature. Its temperature coefficient of resistance is high, nonlinear, and positive.

In the preferred embodiment, thermistor 80 is a Keystone Carbon model RL4510-50-120-120-PTO. This thermistor has an electrical resistance of approximately 50 ohms when its temperature is below 120 degrees Celsius, and rapidly switches to an electrical resistance of many thousands of ohms as its temperature rises above 120 degrees Celsius. At high temperatures above 120 degrees Celsius, this thermistor can withstand up to 120 VDC or 120 VAC rms applied across its leads. These characteristics are critical to the correct operation of the overvoltage and overcurrent control block 6, as will be described below. The triac 70 is a 4-quadrant device that is equivalent to two silicon controlled rectifiers 72 and 74 connected in anti-parallel with a common gate 71. It provides switching action for either polarity of applied voltage and can be controlled in either polarity from the single gate electrode 71.

Both the thermistor 80 and the triac 70 are commercially available products well known in the art. When enough current is seen at the gate lead of the triac 70, the diodes 72 and 74 are shorted. Any externally-applied overload current will then flow through the triac 70 and the thermistor 80 and returned to the source. The cold impedance of the thermistor is approximately 50 ohms. This impedance limits the maximum overload current to less than 3 amperes at overvoltages up to 120 VDC/VAC applied across terminals 90 and 92. When enough current passes through the thermistor 80 to heat it to switch temperature, its resistance increases, rapidly reducing overload current very effectively and efficiently.

A first transistor 76, having a base 73 and a collector 77, and a second transistor 78, having a base 75 and a collector 79, are used as overload triggers for the triac 70. The base 73 of the first transistor 76 is connected to the +15 v power supply. The base 75 of the second transistor 78 is connected to the −15 v power supply. Both the collector 77 of the first transistor 76 and the collector 79 of the second transistor 78 are connected to the gate 71 of the triac 70.

The operation of the overload trigger is as follows for the first transistor 76. When a voltage level is seen by the emitter of the first transistor 76 that is more positive than the +15 v output of the positive power supply 40, the transistor 76 turns on allowing current to flow. This flow of current then turns on the triac 70 shorting a path between terminals 90 and 92 through thermistor 80. The first transistor 76 is a bipolar PNP.

Analogously for the second transistor 78, when a voltage level is seen by the emitter that is more negative than the −15 v output of the negative power supply 38, the second transistor 78 turns on allowing current to flow. This flow of current turns on the triac 70 thereby shorting a path between terminals 90 and 92 through thermistor 80. The second transistor 78 is a bipolar NPN.

A pair of diodes 62 and 64 is provided to enable the first and second transistor to turn on. Diode 62 which is connected to the base 75 of the second transistor 78 enables it to turn on by eliminating any reverse power current flow in the amplifier 50 negative power supply line 81. Diode 64 which is connected to the base 73 of the first transistor 76 enables it to turn on by eliminating any reverse power current flow in the amplifier 50 positive power supply line 82.

A first supplemental diode 82 is connected from the first electrical connection 68 to the emitter of the first transistor 76. The first supplemental diode 82 is used to supplement the reverse breakdown potential of the base-emitter junction of the first transistor 76. A second supplemental diode 84 is connected from the first electrical connection 68 to the emitter of the second transistor 78. The second supplemental diode 84 is used to supplement the reverse breakdown potential of the base-emitter junction of the second transistor 78 Without diodes 82 and 84, the base-emitter junctions 73 and 75 would conduct in the reverse direction at voltages above 5-7 volts, thus shorting the positive 40 and negative 38 power supplies to each other and to the output of the low power precision operational amplifier 50.

The output of the DC isolation and protection circuit 1 to the external device is at output port 90. Here, the isolated DC signal is transmitted to the external device The output of the triac 70, which is connected to the voltage return 42, is also connected to output port 92. At this port 92 a common potential lead is connected to the external device 9.

The overload control block 6, in cooperation with the other blocks, helps to insure precision analog signals at output ports 90 and 92 under hostile electrical conditions. Overload control block 6 also protects circuit 1 from damage if up to 120 VDC/VAC is continuously applied across terminals 90 and 92 by the external device. From these ports 90 and 92 the precision analog signal is passed to the external device 9.

It is additionally important to note at this point that a major consideration in the preferred embodiment is the delay time of 20 microseconds introduced by the use of an AD210 as the isolation amplifier 20. This time delay may cause an unacceptable phase shift for AC signals that have to be in phase with an external reference. A solution to the phase problem is to use a phase lead circuit on the input reference used for signal modulation to compensate for the time delay. This solution is recommended only when phase lag is less than 25 degrees, which occurs when the frequency is at or below approximately 3 KHz.

The circuit 1 can be used at other gain settings, which will result in varying amounts of offset voltage drift. For example, when the gain is reduced from 1.5 to 1.0, the offset voltage drift will reduce from 66 to 45 microvolts per degree C.

It should now be readily apparent to those skilled in the art that a novel DC isolation and protection system and circuit capable of achieving the stated objects of the invention has been provided. A DC isolation amplifier couples and buffers the DC component of a computer output. This signal is amplified by a low power precision amplifier which produces precision analog signals for output to the external device. Protection circuitry contains a thermistor which operates with a triac, a plurality of transistors, diodes, and resistors, and the circuit's novel design to prevent damage from externally applied overvoltage. In addition, each major subcomponent has its own protection and stabilization circuitry comprised primarily of resistors, diodes and capacitors.

It should further be apparent to those skilled in the art that various changes in form and details of the invention as shown and described may be made. It is intended that such changes be included within the spirit and scope of the claims appended hereto.

What is claimed is:

1. A DC isolation and protection circuit to send precision analog signals between a signal source means and an external device where a variance exists between the ground potential of the signal source means and the external device, comprising:

- an isolation amplifier for isolating the DC signal input to the circuit from the signal source means;
- a first protection circuit connected to protect the isolation amplifier;
- a low power precision operational amplifier connected to the output of the isolation amplifier, having a negative and positive supply lead and means for setting gain, for amplifying and buffering the isolated DC signal output by the isolation amplifier;
- a second protection circuit connected to protect the low power precision operational amplifier;
- means for limiting overload voltage within the circuit; and
- means for limiting overload current within the circuit.

2. The DC isolation and protection circuit of claim 1 wherein the isolation amplifier further comprises:

- an input operational amplifier having means for gain setting;
- an internal transformer coupler connected to couple the DC signal from the signal source means to the input operational amplifier; and
- a positive and a negative power supply for powering the input operational amplifier and the low power precision operational amplifier.

3. The DC isolation and protection circuit of claim 2 wherein the first protection circuit further comprises

- a first capacitor for filtering ripple on the input operational amplifier power supply;
- a first bias current balancing resistor for the input operational amplifier for canceling effects of bias current; and
- a first and a second diode in combination with a first input resistor for protecting the inputs of the input operational amplifier.

4. The DC isolation and protection circuit of claim 3 wherein the first bias current balancing resistor has a resistance equal to the parallel combination of the gain setting means.

5. The DC isolation and protection circuit of claim 2 wherein the second protection circuit further comprises:

a second capacitor for stabilizing ringing in the output of the low power precision operational amplifier;

a second bias current balancing resistor for the low power precision operational amplifier for canceling the effects of bias current; and a third and fourth diode in combination with a second input resistor for protecting the inputs of the low power precision operational amplifier.

6. The DC isolation and protection circuit of claim 5 wherein the second bias current balancing resistor has a resistance equal to the parallel combination of the gain setting means of the low power precision operational amplifier.

7. The DC isolation and protection circuit of claim 5 further comprising a fifth diode for protecting the isolation amplifier and the low power precision operational amplifier from the reverse flow of current in the negative supply lead of the low power precision operational amplifier.

8. The DC isolation and protection circuit of claim 5 further comprising a sixth diode for protecting the isolation amplifier and the low power precision operational amplifier from the reverse flow of current in the positive supply lead of the low power precision operational amplifier.

9. The DC isolation and protection circuit of claim 2 wherein the voltage limiting means further comprises:

a triac;

a first and second transistor each connected to the triac for turning on the triac in overvoltage conditions, the first transistor being responsive to positive overvoltages and the second transistor being responsive to negative overvoltages;

a seventh and eighth diode connected to supplement the reverse breakdown potential of the first and second transistor; and a voltage return connected to the output of the triac to return overload current once a transistor has turned the triac on.

10. The DC isolation and protection circuit of claim 9 wherein a fifth diode enables the second transistor to turn on by eliminating any reverse power current flow in the positive supply lead of the low power precision operational amplifier.

11. The DC isolation and protection circuit of claim 9 wherein a sixth diode enables the first transistor to turn on by eliminating any reverse power current flow in the negative supply lead of the low power precision operational amplifier.

12. The DC isolation and protection circuit of claim 2 wherein the means for limiting overload currents further comprises a thermistor.

13. A DC isolation and protection circuit to send precision analog signals between a computer and external device where large common mode voltages exist between the computer and the external device, comprising:

means for isolating a DC signal output from the computer;

means connected to receive the isolated DC signal for amplifying the isolated DC signal; and means connected to the isolating and amplifying means for stabilizing and protecting the isolating and amplifying means, and the isolated and amplified DC signal which is output to the external device, against overload voltage and current.

14. The DC isolation and protection circuit of 13 wherein the isolating means further comprises:

an isolation amplifier, having a power supply and gain setting means; and a first protection circuit connected for protecting the isolation amplifier.

15. The DC isolation and protection circuit of claim 14 wherein the isolation amplifier comprises an input operational amplifier and an internal transformer coupler for isolating the DC component of the signal from the signal source means to the input operational amplifier.

16. The DC isolation and protection circuit of claim 14 wherein the first protection circuit further comprises:

a first capacitor for filtering the current on the first operational amplifier power supply connected between said power supply and a voltage return;

a first bias current balancing resistor connected to an input of the first operational amplifier for canceling the effects of bias current; and a first and second diode connected across the input to the first operational amplifier in combination with a first resistor for protecting the input of the first operational amplifier.

17. The DC isolation and protection circuit of claim 13 wherein the amplifying means further comprises:

a precision operational amplifier, having a negative and positive supply lead and a gain setting means connected thereto, for amplifying and buffering the isolated DC signal output from the isolating means; and a second protection circuit connected to the precision operational amplifier for protecting the precision operational amplifier.

18. The DC isolation and protection circuit of claim 17 wherein the second protection circuit further comprises:

a second capacitor connected between an output and an input of the precision operational amplifier for stabilizing ringing in the output of the second operational amplifier;

a second bias current balancing resistor connected to the input of the precision operational amplifier for canceling the effects of bias current; and a third and fourth diode connected across the input of the precision operational amplifier in combination with a second input resistor for protecting the input to the second operational amplifier.

19. The DC isolation and protection circuit of claim 17 further comprising means for protecting the precision operational amplifier and the isolation amplifier from the reverse flows of current in the negative and positive supply lead of the precision operational amplifier.

20. The DC isolation and protection circuit of claim 13 wherein the protecting means further comprises means for limiting overload voltage and current.

21. The DC isolation and protection circuit of claim 20 wherein the means for limiting overvoltage further comprises:

a voltage return;

means connected to the voltage return for diverting overvoltages to the voltage return; and a first and second transistor each connected to the overvoltage diverting means for turning it on in overvoltage conditions, the first transistor being responsive to positive overvoltages and the second transistor being responsive to negative overvoltages.

22. The DC isolation and protection circuit of claim 21 wherein the overcurrent limiting means further comprises a thermistor and a triac in series with one another, connected to the overvoltage limiting means.

23. A DC isolation and protection circuit to send an analog signal between a computer and external device where a variance exists between the ground potential of the computer and the external device, comprising:

a first operational amplifier having first and second gain setting resistors, for buffering the analog signal, said first operational amplifier having an input coupled to said computer and an output;

a first protection circuit connected to the first operational amplifier for protecting the first operational amplifier;

a second operational amplifier, having third and fourth gain setting resistors, an input and an output, said second operational amplifier output being coupled to said external device;

means coupled to said first and second operational amplifiers for supplying power to them;

a transformer coupled between said output of said first operational amplifier and said input of said second operational amplifier for isolating said analog signal, said second operational amplifier buffering and amplifying said isolated analog signal;

a second protection circuit connected to the second operational amplifier for protecting the second operational amplifier;

means connected to the second operational amplifier, the external device and said means for supplying power for limiting overload voltage; and means connected to the second operational amplifier, the external device and said means for supplying power for limiting overload current.

24. The DC isolation and protection circuit of claim 1 wherein the signal source means is a computer.

* * * * *